United States Patent
Taraschuk et al.

(10) Patent No.: US 6,781,537 B1
(45) Date of Patent: Aug. 24, 2004

(54) HIGH SPEED DIGITAL TO ANALOG CONVERTER

(75) Inventors: Terrance Taraschuk, Ottawa (CA); Kim B. Roberts, Nepean (CA); Leo L. Strawczynski, Ottawa (CA)

(73) Assignee: Nortel Networks Limited, St. Laurent (CA)

(*) Notice: Subject to any disclaimer, the term of this patent is extended or adjusted under 35 U.S.C. 154(b) by 0 days.

(21) Appl. No.: 10/457,528

(22) Filed: Jun. 10, 2003

(51) Int. Cl.[7] .............................................. H03M 1/66
(52) U.S. Cl. ...................................... 341/144; 341/137
(58) Field of Search .............................. 341/144, 118, 341/120, 137, 143

(56) References Cited

U.S. PATENT DOCUMENTS

| | | | |
|---|---|---|---|
| 5,008,673 A | * 4/1991 | Ishii ........................... | 341/144 |
| 5,148,503 A | 9/1992 | Skeie ........................... | 385/3 |
| 5,311,346 A | 5/1994 | Haas et al. .................. | 359/156 |
| 5,408,498 A | 4/1995 | Yoshida ....................... | 375/286 |
| 5,416,626 A | 5/1995 | Taylor ......................... | 359/156 |
| 5,513,029 A | 4/1996 | Roberts ....................... | 359/177 |
| 5,579,328 A | 11/1996 | Habel et al. ................. | 372/31 |
| 5,761,225 A | 6/1998 | Fidric et al. ................. | 372/6 |
| 5,892,858 A | 4/1999 | Vaziri et al. ................ | 385/2 |
| 5,949,560 A | 9/1999 | Roberts et al. ............. | 359/110 |
| 5,999,258 A | 12/1999 | Roberts ....................... | 356/345 |
| 6,067,180 A | 5/2000 | Roberts ....................... | 359/156 |
| 6,115,162 A | 9/2000 | Graves et al. .............. | 359/173 |
| 6,124,960 A | 9/2000 | Garthe et al. ............... | 359/181 |
| 6,128,111 A | 10/2000 | Roberts ....................... | 359/110 |
| 6,205,262 B1 | 3/2001 | Shen ........................... | 385/11 |
| 6,262,834 B1 | 7/2001 | Nichols et al. ............. | 359/301 |
| 6,304,369 B1 | 10/2001 | Piehler ....................... | 359/337.4 |
| 6,441,932 B1 | 8/2002 | Helkey ........................ | 359/110 |
| 6,473,013 B1 | 10/2002 | Velazquez et al. .......... | 341/120 |
| 6,529,150 B1 | * 3/2003 | Shoop et al. ................ | 341/137 |
| 6,559,994 B1 | 5/2003 | Chen et al. .................. | 359/180 |
| 6,580,532 B1 | 6/2003 | Yao et al. .................... | 359/111 |

OTHER PUBLICATIONS

Adaptive Electronic Linearization of Fiber Optic Links, OFC 2003, vol. 2, pp. 477–480, Mar. 2003 Sadhwani et al.
Automated Measurement of Polarization MOde Dispersion Using Jones Matrix Eigenanalysis, IEE Photonics Technology Letters, vol. 4, No. 9, pp. 1066–1069, Sep. 1992, Heffner.
Chromatic Dispersion Mapping by Sensing the Power Distribution of Four–Wave Mixing Along the Fiber Using Brillouin Probing, OFC 2003, vol. 2, pp. 714–716, Herraez et al.
Design of Broad–Band PMD Compensation Filters, IEEE Photonics Technology Letters, vol., 14, No. 8, Aug. 2002, A. Eyal et al.

(List continued on next page.)

*Primary Examiner*—Brian Young
*Assistant Examiner*—Joseph Lauture
(74) *Attorney, Agent, or Firm*—Kent Daniels; Ogilvy Renault

(57) ABSTRACT

A high speed D/A converter includes a phase aligner, and a vector summation block. The phase aligner operates to ensure precise phase alignment between corresponding bits of a parallel N-bit digital signal having a data rate of at least 2 GHz. The vector addition block performs a vector addition of the phase-aligned bits of the parallel N-bit digital signal. Each bit of the parallel N-bit digital signal can be weighted to ensure a correct additive contribution to the analog signal level appearing at the output of the D/A converter. Vector addition of the weighted bits can be accomplished using a microwave signal combiner network in the form of either a multistage parallel cascade of impedance matched junctions, or a linear cascade of junctions.

36 Claims, 9 Drawing Sheets

OTHER PUBLICATIONS

Dispersion Compensation by Active Predistorted Signal Synthesis, Journal of Lightwave Technology, vol. LT–3, No. 4, Aug. 1985, Thomas L. Koch and Rod C. Alferness.

Dispersion Compensation with an SBS–Suppressed Fiber Phase Conjugator Using Synchronized Phase Modulation, OFC 2003, vol. 2, pp. 716–717, M. Tani.

Electrical Signal Processing Techniques in Long–Hual Fiber–Optic Systems, 1990 IEEE–Transactions on Communications, vol. 38, No. 9, Jack H. Winters, et al.

Exact Compensation for both Chromatic Dispersion and Kerr Effect in a Transmission Fiber Using Optical Phase Conjuction, Journal of Lightwave Technology, vol. 14, No, 3, Mar. 1996, Watanabe et al.

High–Dynamic–Range Laser Amplitude and Phase Noise Measurement Techniques, IEEE Journal on Selected Topics in Quantum Electronics, vol. 7, No. 4, Jul./Aug. 2001, Ryan P. Scott et al.

Measurement of High–Order Polarization Mode Dispersion, IEEE Photonics Technology Letters, vol. 12, No. 7, Jul. 2000, Yi Li et al.

Mitigation of Dispersion–Induced Effects Using SOA in Analog Optical Transmission, IEEE Photonics Technology Letters, vol. 14, No. 8, Aug. 2002, Duk–Ho Jeon et al.

Performance of Smart Lightwave Receivers With Linear Equalization, Journal of Lightwave Technology, vol. 10, No. 8, Aug. 1992, John C. Cartledge, et al.

Polarization Effects in Lightwave Sytems, Craig, D. Poole and Jonathan Nage. Date unknown.

Polarization Modulated Direct Detection Optical Transmission System, Journal of Lightwave Technology, vol. 10, No. 12, Dec. 1992.

Predistortion of Electroabsorption Modulators for Analog CATV Systems at 1.55 *m, Journal of Lightwave Technology, vol. 15, No. 9, Sep. 1997, Gordon C. Wilson et al.

Predistortion Techniques for Linearization of External Modulators, 1999 IEEE—Gordon WIlson, Lucent Technologies, NJ07733, U.S.A.

Reduction of Dispersion–Induced Distortion in SCM Transmission Systems by Using Predistortion–Linearized MQW–EA Modulatirs, Journal of Lightwave Technology, vol. 15, No. 2, Feb. 1997, T. Iwai et al.

Representation of Second–Order Polarisation Mode Dispersion, Electronics Letters, vol. 35, No. 19, Sep. 16, 1999, A. Eyal et al.

Signal Distortion and Noise in AM–SCM Transmission Systems Employing the Feedfrorward Linearized MQW–EA External Modulator, Journal of Lightwave Technology, vol. 15, No. 8, Aug. 1995, T. Iwai et al.

Soliton Transmission using Periodic Dispersion Compensation, Journal of Lightwave Technology, vol. 15, No. 10, Oct. 1997, Nicholas J. Smith et al.

Theoretical Basis of Polarization Mode Dispersion Equalization up to the Second Order, Journal of Lightwave Technology, vol. 18, No. 4, Apr. 2000, Teruhiko Kudou et al.

* cited by examiner

HIGH SPEED DIGITAL TO ANALOG CONVERTER

CROSS-REFERENCE TO RELATED APPLICATIONS

This is the first application filed for the present invention.

MICROFICHE APPENDIX

Not Applicable

TECHNICAL FIELD

The present invention relates in general to signal processing, and in particular to a high speed digital to analog converter.

BACKGROUND OF THE INVENTION

Digital to Analog (D/A) converters are very well known in the art. In general, D/A converters are designed to convert an N-bit digital value into a corresponding analog signal level. The number (N) of bits forming the N-bit digital value may be as low as two, but 6- and 8-bit D/A converters are ubiquitous, and 16-bit D/A converters are not uncommon.

As shown in FIG. 1, a typical D/A converter 2 utilizes a ladder (or inverted ladder) structure 4 driven by a precision voltage reference (Vref) to equalize logic levels across each of the bits ($B_1$–$B_6$) of an input digital word 6. The equalized bits are then added, (using, for example, a conventional Operational Amplifier [Op-Amp] based analog voltage ADDer 8 to generate the desired level of the output analog signal 10. As may be seen in FIG. 1, precise selection of input resistor values (R1–R6) provides input scaling, so that each bit ($B_i$) makes an appropriate (additive) contribution ($S_i$) to the total value (S) of the analog output 10. Thus, for example, the total output signal level (S) will be given by $$S = \sum_{i=1}^{N} S_i,$$

and the resistor values will be selected such that the response to each of the input data bits ($B_1$-$B_6$) follows the conventional binary powers of two; that is, for the ith input data bit ($B_i$), the response, in terms of the contribution ($S_i$) to the total output signal level (S) will be proportional to $S_i = 2^{i-1} \cdot B_i$.

Other D/A converter designs are known. A limitation of all conventional D/A converters is that propagation delays within the converter impose severe speed limitations. At data rates below a few MHz, these speed limitations do not produce severe problems. However, as data rates increase beyond a few 10's of MHz, propagation delays become increasingly problematic. In addition, as data rates increase into the radio frequency (rf) and microwave range, gain/bandwidth limitations and signal reflections due to impedance mismatches become progressively significant. All of these effects render accurate high speed D/A conversion very difficult.

U.S. Pat. No. 5,408,498, which issued to Yoshida on Apr. 18, 1995 teaches a serial signal transmission system in which a binary serial data signal is converted into a quaternary serial signal for transmission. Thus the binary serial data signal is treated as a string of successive 2-bit digital values, which are converted into corresponding 4-level analog symbols for transmission. At the receiver, incoming 4-level analog symbols are decoded (e.g. by comparing each symbol to a set of predetermined threshold levels) to recover the original 2-bit digital values and thereby restore the binary serial data signal. Thus the system of Yoshida provides a 2-bit D/A converter capable of producing a 4-level analog output signal. This system has the benefit of reducing the symbol rate through the transmission system (by a factor of two) without loss of data.

The use of a 4-level analog signal for transmission means that the threshold levels used for decoding the symbols can be separated comparatively widely. This provides some noise tolerance, and also relaxes the requirement for accurate D/A conversion in the transmitter. This, in turn, allows the D/A converter to be run at higher speeds, because some degradation in the accuracy of D/A conversion is permissible.

However, in some applications, it is desirable to provide accurate digital-to-analog conversion of multi-bit digital values, and at very high data rates. For example, Applicant's co-pending U.S. patent application Ser. No. 10/262,944, entitled Electrical Domain Compensation Of Optical Dispersion In An Optical Communications System, filed on Oct. 3, 2002, teaches a system for compensating chromatic dispersion in an optical communications system, by predistorting an input binary signal, and then using the predistorted signal to drive optical modulators. In this application, D/A conversion to at least 5 bits precision, at a sample rate that is double the bit rate is necessary for successful compensation of dispersion. At sufficiently low bit-rates, known D/A converters can be employed to provide the necessary functionality. However, it is desirable to provide bit rates of 10.7 GB/s, which implies a requirement for a D/A converter running at a sample rate of 21.4 Gigasamples-per-second. No known devices are capable of providing accurate D/A conversion at that speed.

Accordingly, a method and system for enabling high speed digital-to-analog conversion remains highly desirable. For the purposes of the present invention, "high speed digital-to-analog conversion" shall be understood to refer to digital-to-analog conversion in which N-bit digital values (where $N \geq 4$) are latched into the D/A converter, and corresponding $2^N$-level analog samples output from the D/A converter, at a sample rate of 2 Gigasamples-per-second or faster.

SUMMARY OF THE INVENTION

Accordingly, an object of the present invention is to provide a high speed Digital to Analog (D/A) converter.

Thus, an aspect of the present invention provides a high speed Digital to Analog (D/A) converter. The D/A converter includes a phase aligner, and a vector summation block. The phase aligner operates to ensure precise phase alignment between corresponding bits of a parallel N-bit digital signal having a data rate of at least 2 GHz. The vector addition block performs a vector addition of the phase-aligned bits of the parallel N-bit digital signal.

In embodiments of the invention, the vector addition block includes means for weighting each bit of the parallel N-bit digital signal, and a microwave signal combiner network for adding the weighted bits of the parallel N-bit digital signal. The microwave signal combiner network can be provided as either a multistage parallel cascade of impedance matched junctions, or a linear cascade of junctions. The weighting means may be provided by an attenuator array and/or an insertion loss of each junction forming the combiner network.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

The present invention provides a high speed digital-to-analog (D/A) converter capable of accurate digital-to-analog conversion of a parallel multi-bit digital signal into a corresponding analog signal. Various embodiments of the invention are described below with reference to FIGS. 2 through 6.

Figure 1:
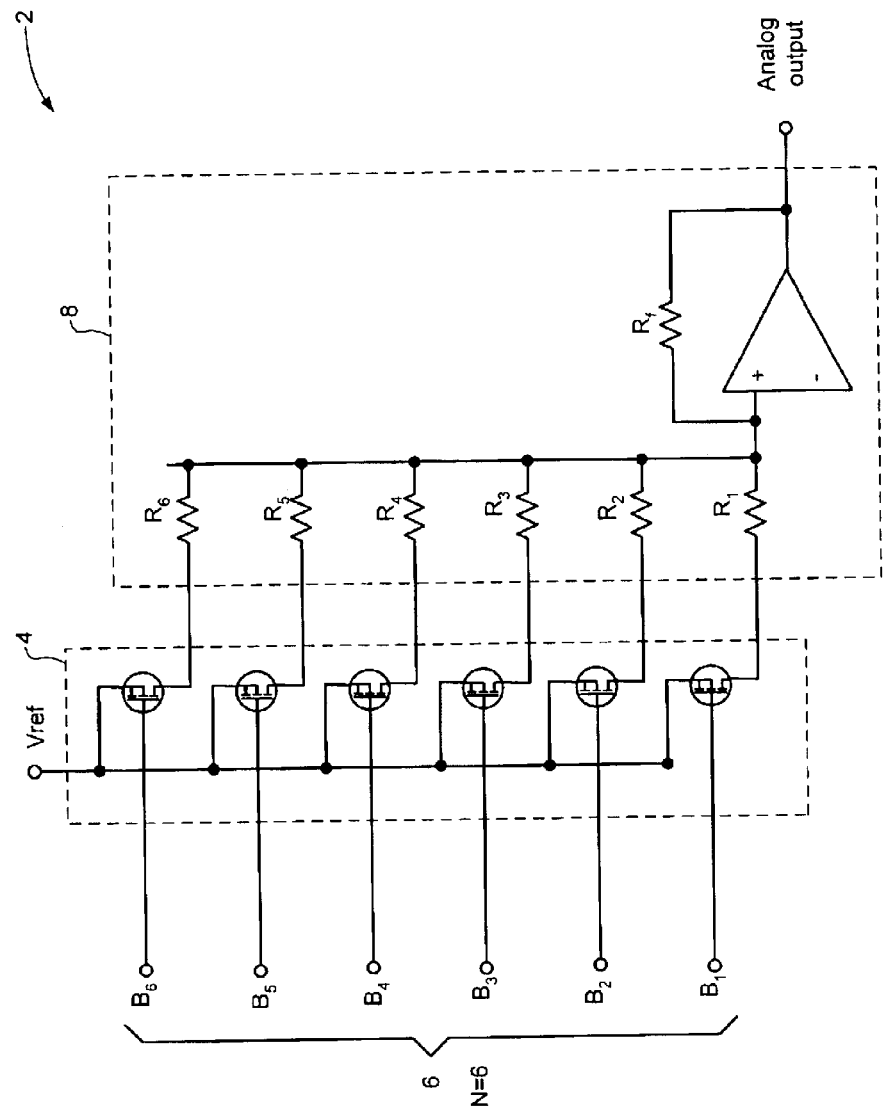
FIG. 1 is a block diagram schematically illustrating a conventional digital-to-analog converter.
Figure 2:
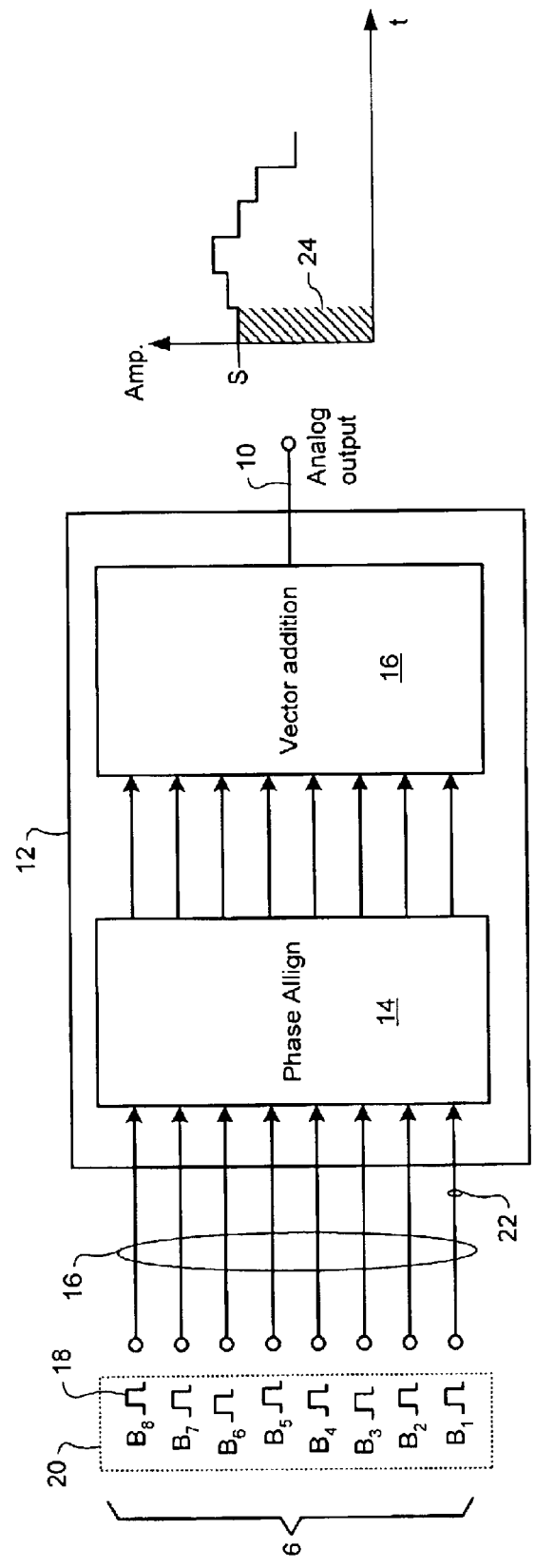
FIG. 2 is a block diagram schematically illustrating principal elements in a high-speed digital-to analog converter in accordance with the present invention.

As shown in FIG. 2, a D/A converter 12 in accordance with the present invention generally comprises a phase aligner 14 and a vector addition block 16. The phase aligner is coupled to receive a parallel N-bit digital signal 6 through a corresponding N-bit parallel data bus 1717. In general, the number (N) of bits of the parallel N-bit data signal 6 may be as low as 2, but 4 or more bits of precision will generally be preferred. In the illustrated embodiment N=8, although this is by no means limitative of the present invention. The parallel N-bit digital signal 6 is formatted in a conventional manner, such that each bit 18 of a digital word 20 is latched into the D/A converter, in parallel, via respective lines 22 of the data bus 1717. For each digital word 20 latched into the D/A converter 12, a corresponding sample 24, having an analog signal level(s) derived from the digital word 20, is output from the D/A converter 12. As will be appreciated, the sample rate of the D/A converter 12 will be equivalent to the line rate of the input data bus 1717 (that is, the rate at which successive digital words 20 are latched into the D/A converter 12), and will be at least 2 Hz.

In general, the phase aligner operates to ensure precise phase alignment between corresponding bits 18 of each successive word 20 of the parallel N-bit digital signal 6. Various methods may be used to obtain this result. In the embodiment illustrated in FIG. 3a, the phase aligner comprises an array of flip-flop circuits 26 controlled by a common master clock 28. Thus, a respective flip-flop circuit 26 is inserted to receive each bit 18 of the parallel N-bit digital signal 6. Corresponding bits 18 are output from the flip-flop circuits 26 at the timing of the master clock 28. By properly accounting for propagation delays between the master clock 28 and each flip-flop circuit 26, very precise alignment (on the order of parts-per-million phase error) between the bits 18 of each word 20 of the digital signal 6 can be obtained. A limitation of this approach is that a maximum phase difference ($\Delta\phi$) between bits 18 received by the phase aligner 14 must be less than a pulse duration.

Figure 3B:
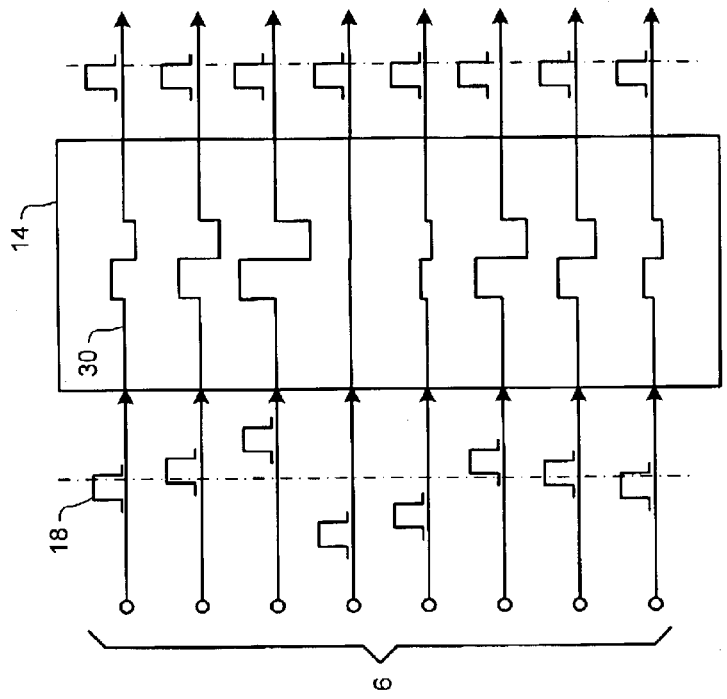
FIGS. 3a–3b are block diagrams schematically illustrating respective alternative embodiments of the phase alignment block of a first embodiment of a vector addition block of the D/A converter of FIG. 2.
Figure 3A:
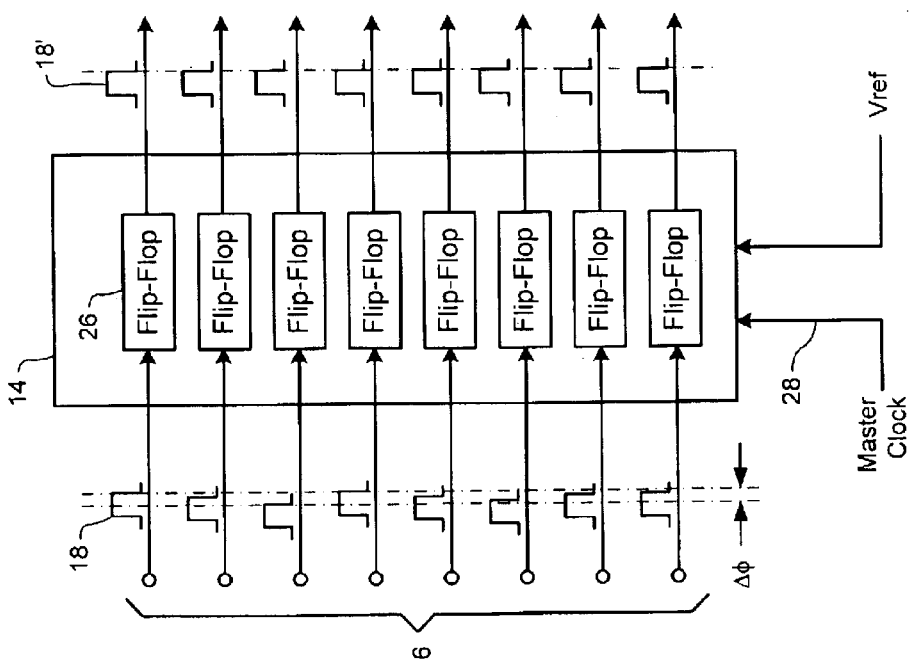

Other methods may be used to implement the phase aligner 14. For example, the phase relationship between corresponding bits of the digital signal can frequently be known in advance, by either analyzing the design or the output of upstream digital circuits used to generate the digital signal 6. Based on a known phase mismatch between corresponding bits 18 of the digital signal 6 arriving at the phase aligner 14, precise phase alignment can be achieved by means of suitable differences in the path length of signal transmission lines 30 used to convey each bit 18 to the vector addition block 16, as shown in FIG. 3b. Alternatively, known phase shifters can be inserted into each transmission line, and driven in a known manner to impose a controllable phase shift to each bit 18 of the digital signal 6.

By any of the above means, the phase aligner 14 operates to ensure that corresponding bits 18 of each word 20 of the parallel N-bit digital signal 6 are supplied to the vector addition block 16 phase aligned within a very close tolerance.

As described above, the parallel N-bit digital signal 6 has a line rate of at least 2 GHz. Thus each line 22 of the parallel bus 17 can be considered to be carrying a serial bit stream having a bit rate equivalent to the line rate, that is, at least 2 Gb/s. As may be appreciated, a serial bit stream may be mathematically approximated by way of a Fourier series summation of sinusoidal signals. At a bit rate of 2 or more Gb/s, at least some of the sinusoid signals of the Fourier series approximation will be in the microwave frequency range. Thus, in accordance with the present invention, microwave signal combining techniques may be used to perform a vector summation of all of the bits 18 of the input digital signal 6. Because the phase aligner 14 ensures precise alignment between corresponding bits 18 of each word 20 of the input digital signal 6, the phase component of the vector addition can be neglected, and the magnitude component of the vector addition will produce a "linear" summation of the analog magnitudes of each bit 18 of the input digital signal 6. The manner in which this phenomena is used to accomplish accurate D/A conversion of the input digital signal is described below, by way of example, with reference to FIGS. 3 and 4a–4d.

Figure 4A:
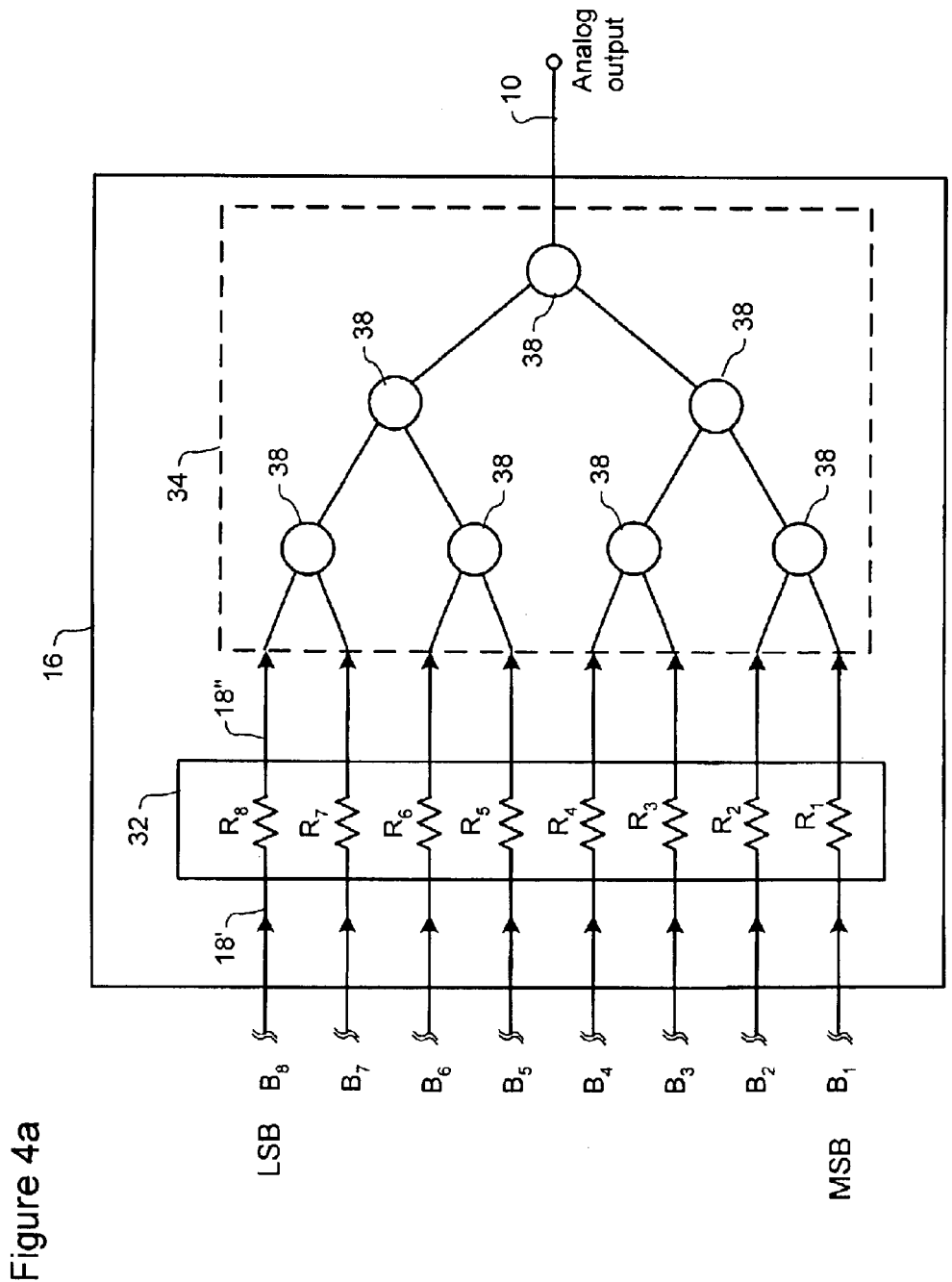
FIGS. 4a–4d are block diagrams schematically illustrating respective alternative embodiments of the vector addition block of the D/A converter of FIG. 2.

FIG. 4a is a block diagram schematically illustrating a first embodiment of the vector addition block of FIG. 2. In the embodiment of FIG. 4a, the vector addition block 16 comprises an attenuator array 32 for weighting each bit 18 of the input digital signal 6, and a microwave combiner network 34. The attenuator array 32 can be constructed in various ways known in the art to provide a selected attenuation to each bit 18' of the digital signal 6. For simplicity of illustration, the attenuator array 32 is illustrated by an array of resistors $R_1$–$R_8$ inserted into each line 22 of the database 16. With this arrangement, each bit 18 of the digital signal 6 is subjected to a respective selected attenuation. For example, the resistor $R_1$ may be set to a value of zero, so that the Most Significant Bit (MSB) of the digital signal 6 passes through the array 32 without attenuation. The remaining resistors ($R_2$–$R_8$ respectively inserted in lines 2 through 8 of the bus 17) can be selected to provide progressively greater attenuations, so that a logic-1 voltage level follows a power of two series between the Most Significant Bit and the Least Significant Bit (LSB) of the digital signal 6. Thus, for example, the MSB ($B_1$) passes through the attenuator array unchanged and thus emerges having a logic-1 voltage of, for example, 3.5 volts. The attenuator $R_2$ of the next most significant bit ($B_2$) is selected so that the respective bit ($B_2$) is attenuated to one half that of ($B_1$), and therefore emerges from the attenuator array with a logic-1 voltage of 1.75 volts. Similarly, bit $B_3$ is attenuated to one half of the level of $B_2$, and therefore emerges from the attenuator array 32 with a logic-1 voltage of 0.875 volts. This power of two series can be continued across all of the bits 18 of the digital signal 6.

As a result of the above weighting of the bits 18 of the digital signal 6, linear summation of the weighted bits 18" emerging from the attenuator array 32 will produce the desired analog sample value(s) that corresponds with the digital value of the respective word 20 of the input digital signal 6. In order to accomplish the required linear summation of weighted bits 18", the microwave combiner network 34 is provided as a multi-staged cascade of parallel impedance matched junctions 36. Each junction 36 is designed using known microwave signal combining techniques to have a selected bandwidth and insertion loss. As is known in the art, performance of an impedance matched junction is a trade off between bandwidth and insertion loss. Preferably the bandwidth is selected to be wide enough to avoid undue distortion of each bit stream, without imposing an undue insertion loss penalty. By ensuring that the insertion loss of each impedance matched junction is substantially identical, the weighting relationships between each of the bits 18", imposed by the attenuator array, will be preserved through the combiner network. Consequently, the network response, in terms of the additive contribution of each weighted bit 18" to the total signal level of the analog output signal, will follow the desired powers of two distribution between the MSB and the LSB of the digital signal 6. Proper phase alignment between all of the weighted bits 18" as they traverse the combiner network 34 can be ensured by matching transmission line lengths through the network 34.

Figure 4B:
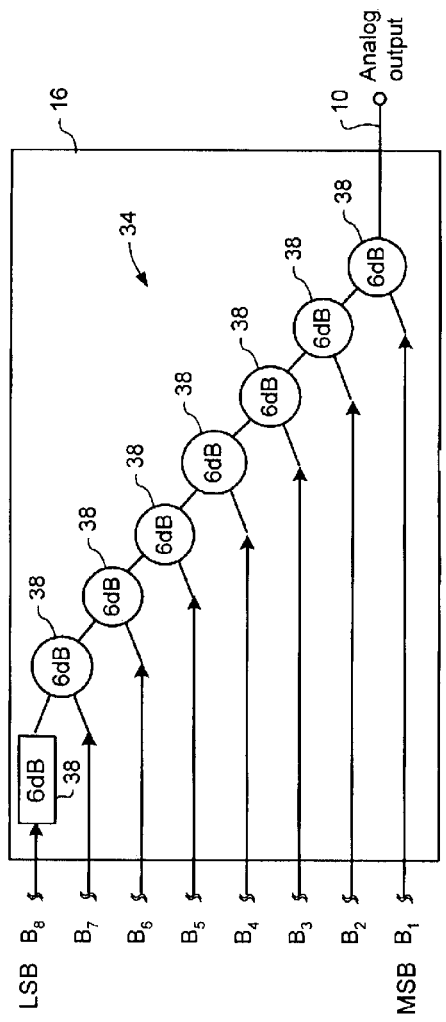
Figure 4C:
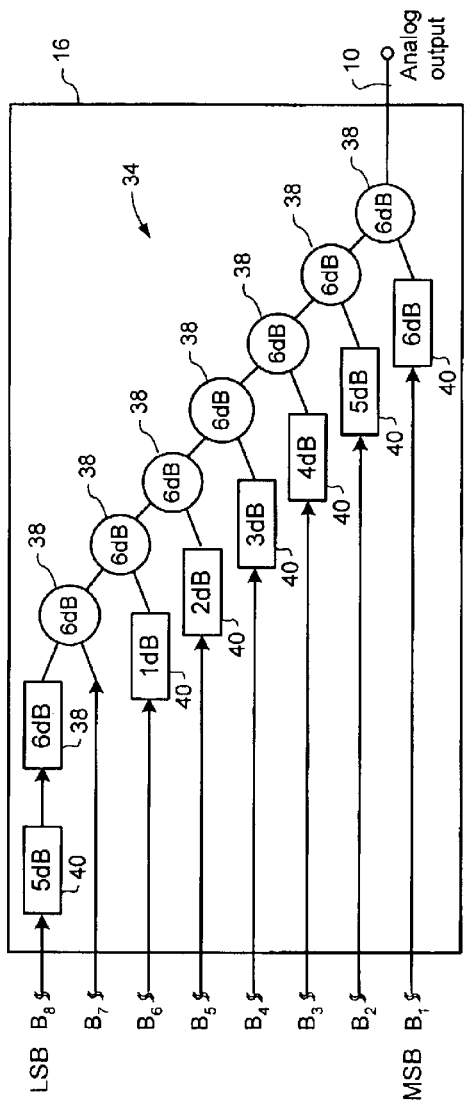
Figure 4D:
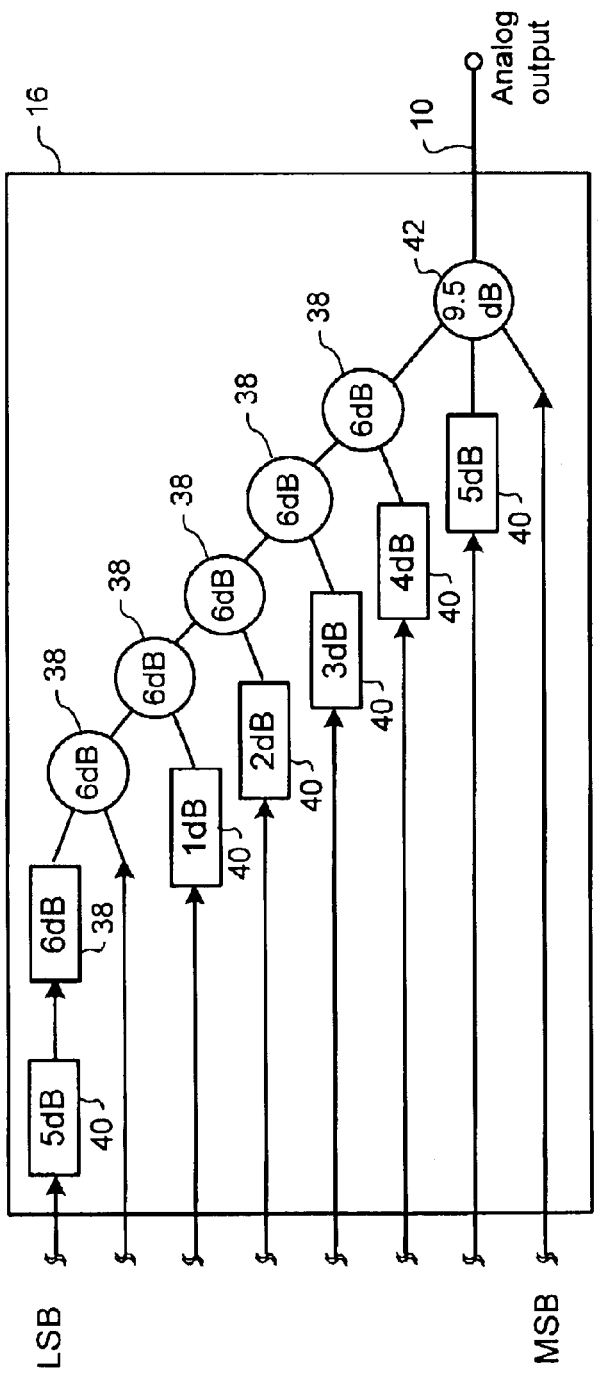

As described above, the appropriate system response to each bit 18, in terms of the additive contribution of each bit 18 to the total analog output signal level(s), is provided by the weighting applied to each bit 18 of the input digital signal 6. In the embodiment of FIG. 4a, this weighting is provided by an attenuator array 32 arranged to impose a selected attenuation to each bit 18 of the digital signal 6, so that the resulting weighted bits 18" are then supplied to the combiner network 34 to produce the analog output signal 10. With perfectly matched logic levels (across all of the bits 18 of the digital signal 6) very precise phase alignment, and perfect matching of propagation delays through the attenuator array 32 and signal combiner network 34, this architecture will yield the desired D/A conversion functionality, across any desired number of bits 18 of the input digital signal 6. In practice, highly accurate phase alignment and control of propagation delays can be obtained using known microwave circuit design techniques. In principle, matching of logic levels across the bits 18 of the digital signal 6 may be obtained by use of a precision voltage reference, as described above. In practice, however, perfect matching of logic levels is difficult to achieve, due to thermal effects and manufacturing variations which cause unequal transmission line impedance. In addition, practical signal attenuators of the type that may be used in the attenuator array 32 are non-ideal, and introduce a certain amount of noise. Both of these effects may reduce the accuracy of D/A conversion using the embodiment of FIG. 4a. FIGS. 4b–4d illustrate alternative embodiments of the vector addition block which address at least some of these issues. Compensation for large scale logic level mismatches can be achieved by the addition of a linearizer circuit, as will be described below with respect to FIGS. 5 and 6.

FIG. 4b shows an embodiment of the vector addition block 16 in which the bit weighting function is integrated within the impedance matched signal combiner network 34. In this case, the combiner network 34 is provided as a linear cascade of impedance matched microwave signal junctions 36. By designing each junction 36 with a 6 dB insertion loss, this linear cascade will inherently yield the desired power of two weighting of all of the most significant bits of the input digital signal. The only exception will be the least significant bit (in this case, B8) which requires an additional 6 dB attenuator 38 in order to achieve the proper weighting. Because of the very low weighting applied to the least significant bit, any noise introduced by the 6 dB attenuator 38 will likely not produce significant distortions in the analog output signal 10. As in the embodiment of FIG. 4a, proper phase alignment between each of the bits 18 traversing the combiner network 34 can be obtained by suitable selection of transmission line lengths. The primary advantage of the embodiment of FIG. 4b, is that by using the insertion losses inherent within each junction 36, appropriate signal weightings can be achieved without the use of an attenuator array 32. This avoids noise and signal distortions introduced by the attenuator array 32.

Figure 6:
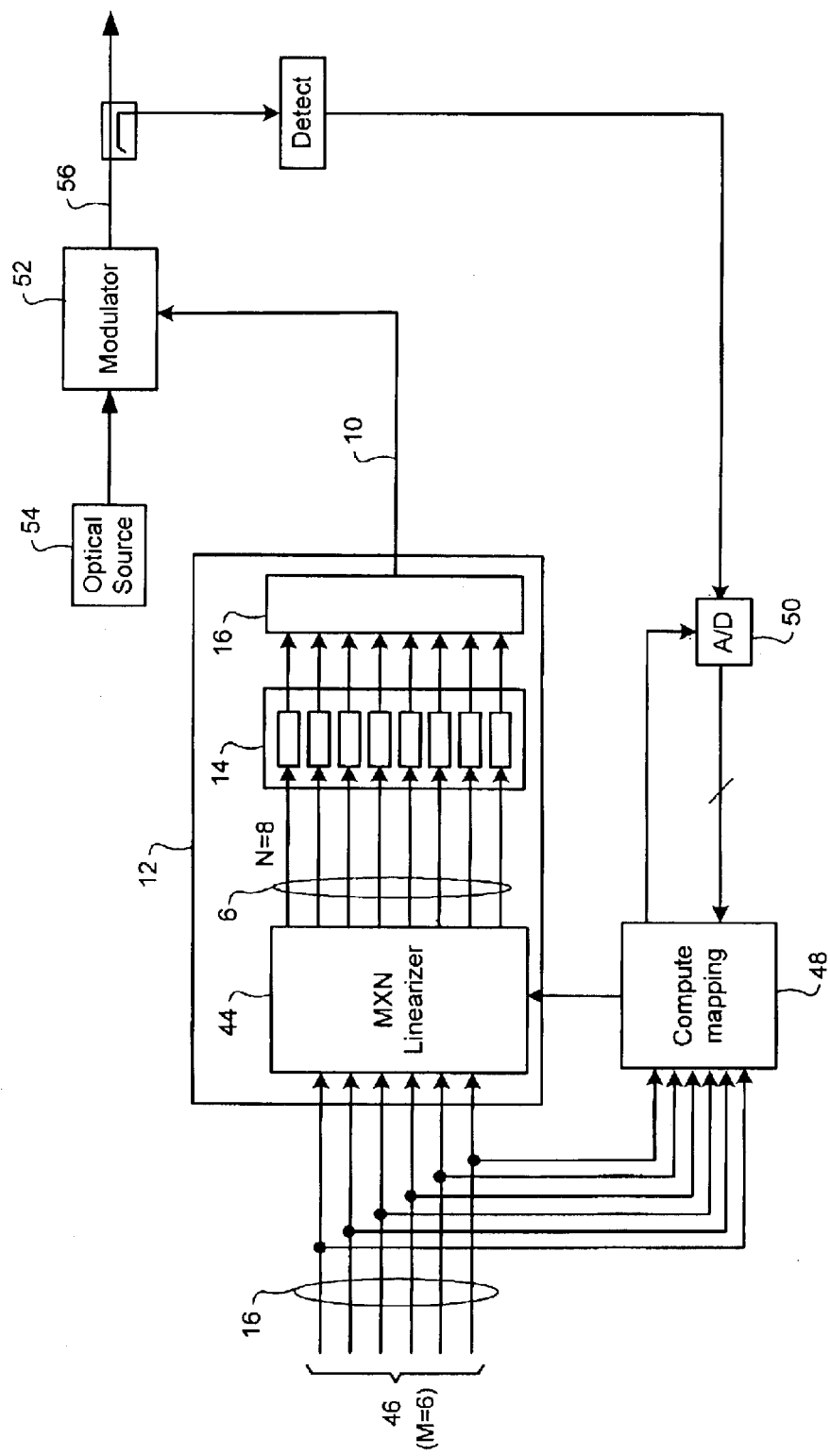
FIG. 6 is a block diagram schematically illustrating a high-speed digital-to-analog converter in accordance with a third embodiment of the present invention, in a system for driving a conventional optical modulator.

As will be described in further detail below, particularly with respect to FIG. 6, it may in some cases be desirable to obtain a response which does not follow the traditional binary power of two distribution across the bits of the digital signal 6. In principle, any desired variations in the response can be obtained by varying the insertion loss of each of the junctions 36 and/or by the addition of attenuators to vary the weighting of each bit 18. In the embodiment of FIG. 4c, the insertion loss of each junction 36 is retained at 6 dB (at least in part to ensure consistent bandwidth and propagation delays through the network 34) and attenuators 40 are introduced to vary the weighting of each of the bits 18. The specific arrangement shown in FIG. 4c provides a 5 dB variation between adjacent bits 18, rather than the 6 dB variation of FIG. 4b. When used to drive an optical modulator (as shown in the embodiments of FIG. 6) this arrangement is found to yield satisfactory results, except that the most significant bit suffers a 12 dB attenuation through the network 34. As shown in FIG. 4d, this high attenuation of the most significant bit can be reduced somewhat by replacing the final two two-way combiners 36 of the series with a single three-way combiner 42 which, in order to obtain matching bandwidth and propagation delays, will have an insertion loss of 9.5 dB. Additional slight improvements in insertion loss can be obtained by careful microwave circuit design.

Figure 5:
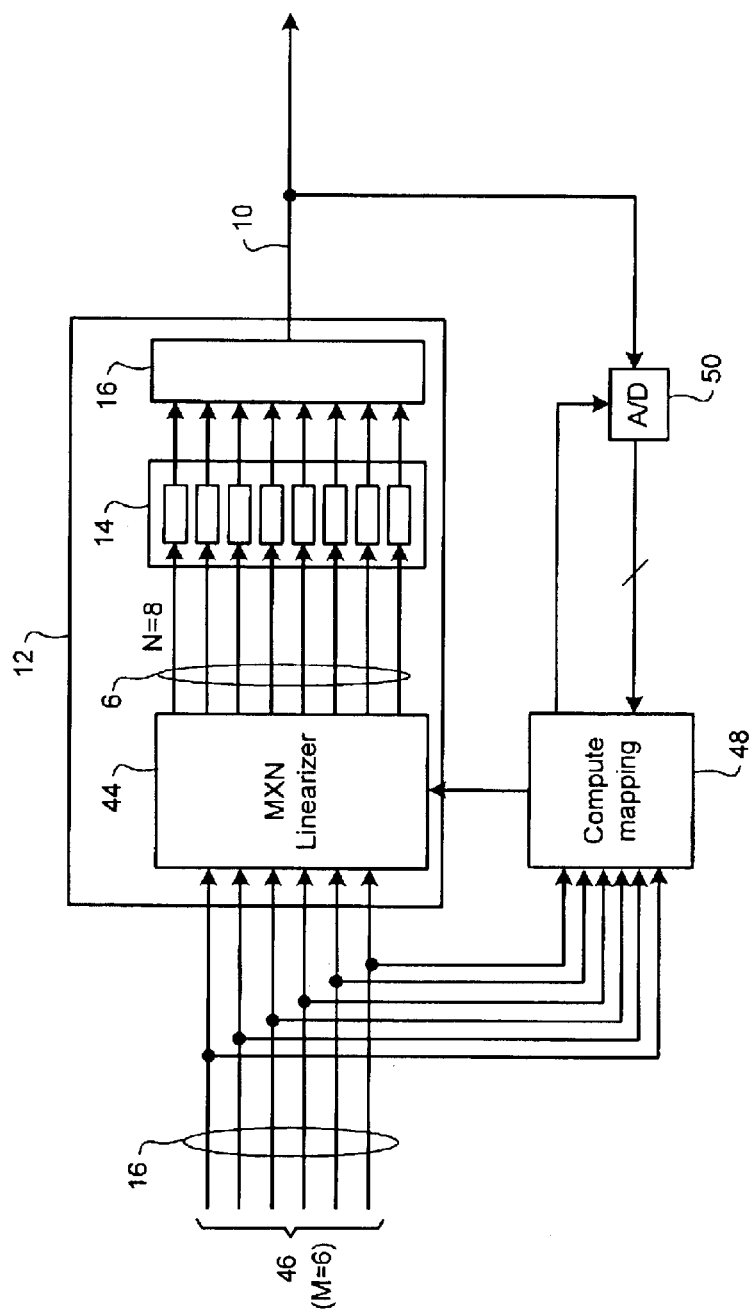
FIG. 5 is a block diagram schematically illustrating principal elements in a high-speed digital-to analog converter in accordance with a second embodiment of the present invention.

As mentioned above, significant logic level mismatches across the bits 18 of the digital signal 6 can be compensated by the use of a linearizer. This arrangement is shown in FIG. 5, which illustrates an M=6-bit D/A converter 12 having a linearizer 44 connected upstream of the phase aligner 14 and vector addition blocks 16. The linearizer 44 is designed in a known manner (e.g., using a random access memory look-up table) to map an M-bit digital signal 46 into an N-bit parallel digital signal 6 for processing by the phase aligner 14 and vector summation block 16. In general, the number (M) of bits of the input digital signal 46 will be less than the number (N) of bits of the parallel digital signal 6 processed by the phase aligner 14 and vector summation block 16. In the illustrated embodiment M=6 and N=8, it being appreciated that these numbers are in no way limitative of the invention. An advantage of using the linearizer 44 is that it enables each M-bit word of the input digital signal 46 to be mapped to a corresponding N-bit word which compensates for any logic level mismatches, and thereby produces an analog signal level (S) at the output 10 of the vector addition block 16 which accurately reflects the digital value represented by the M-bit word of the input digital signal 46 latched into the linearizer 44. In some cases, logic level mismatches may be static and known in advance, for example by analysis of either the design or output of upstream digital devices which produce the M-bit input digital signal 46. In this scenario, the mapping implemented by the linearizer 44 may be calculated in advance and loaded into the linearizer for use during run-time. Alternatively, it may be advantageous to periodically recalculate the mapping to compensate for time varying changes in logic levels. The frequency at which the mapping is re-calculated may, for example, be selected based on an expected time rate of change of logic levels, or other performance parameters of the phase aligner 14 and vector summation block 16. FIG. 5 illustrates an exemplary system for periodically re-calculating the mapping implemented in the linearizer 44. Thus, the M-bit digital signal 46 is tapped and provided to a signal processor 48. The analog output signal (S) is sampled by an analog-to-digital converter 50 and supplied to the signal processor 48. By controlling the timing of the sample detected by the analog-to-digital converter 50, the signal processor 48 can receive an M-bit word of the input digital signal 46 and obtain a sample of the corresponding analog signal level (S) generated by the D/A converter 12 based on that M-bit word. By calculating a difference between the received M-bit word and the sampled analog output signal level (S), the signal processor 48 can readily compute a mapping between the received M-bit word of the input digital signal 46 and an N-bit word required to obtain the desired output analog signal level.

It should be noted that operation of the signal processor 48 is independent of that of the D/A converter 12. Accordingly, while it is necessary for the analog-to-digital converter 50 to sample a discrete level of the analog output signal level (S) corresponding to a single M-bit word, it is not necessary for this operation to be performed for each successive word of the M-bit input digital signal 46. Thus, the process of sampling analog output signal level (S); determining a difference between the sampled signal level (S) and the corresponding M-bit word; recalculation of the mapping, and loading the new mapping into the linearizer 44 can be performed at a rate that is significantly slower than the line rate of the -bit input digital signal 46.

If desired, the analog signal output from the D/A converter 12 can be used to drive an optical modulator 52 so as to modulate an optical signal generated by an optical source 54 such as, for example, a narrow band laser. In this situation, the linearizer 44 can also be used to compensate non-linearities of the optical modulator 52, as shown in FIG. 6. Thus, for example, conventional optical modulators, such as for example, a Mach-Zehnder modulator, display a sinusoidal response to an input control signal. In principle, a mapping can be defined between the M-bit input digital signal 46 and an N-bit signal 6 processed by the phase aligner 14 and vector summation block 16, which compensates for the combined non-linear effects of logic level mismatches through the D/A converter 12 and the sinusoidal response of the modulator 52. As shown in FIG. 6, computation of the suitable mapping can be obtained by receiving an M-bit word of the input digital signal and comparing it to a detected sample of the modulator output 56 in a manner directly analogous to that described above with reference to FIG. 5. In order to simplify the mapping, the bit weightings implemented by the vector summation block 16 can be adjusted from the "normal" powers of two variation across the bits of the N-bit digital signal 6. Thus, for example, the 5 dB variation between adjacent bits described above with reference to FIGS. 4c and 4d can be used. This produces a non-linear D/A converter response which partially off-sets the sinusoidal response of the optical modulator. The combined response of the D/A converter and optical modulator is more nearly linear, and can more easily be corrected by an M×N mapping in the linearizer 44.

Figure 7:
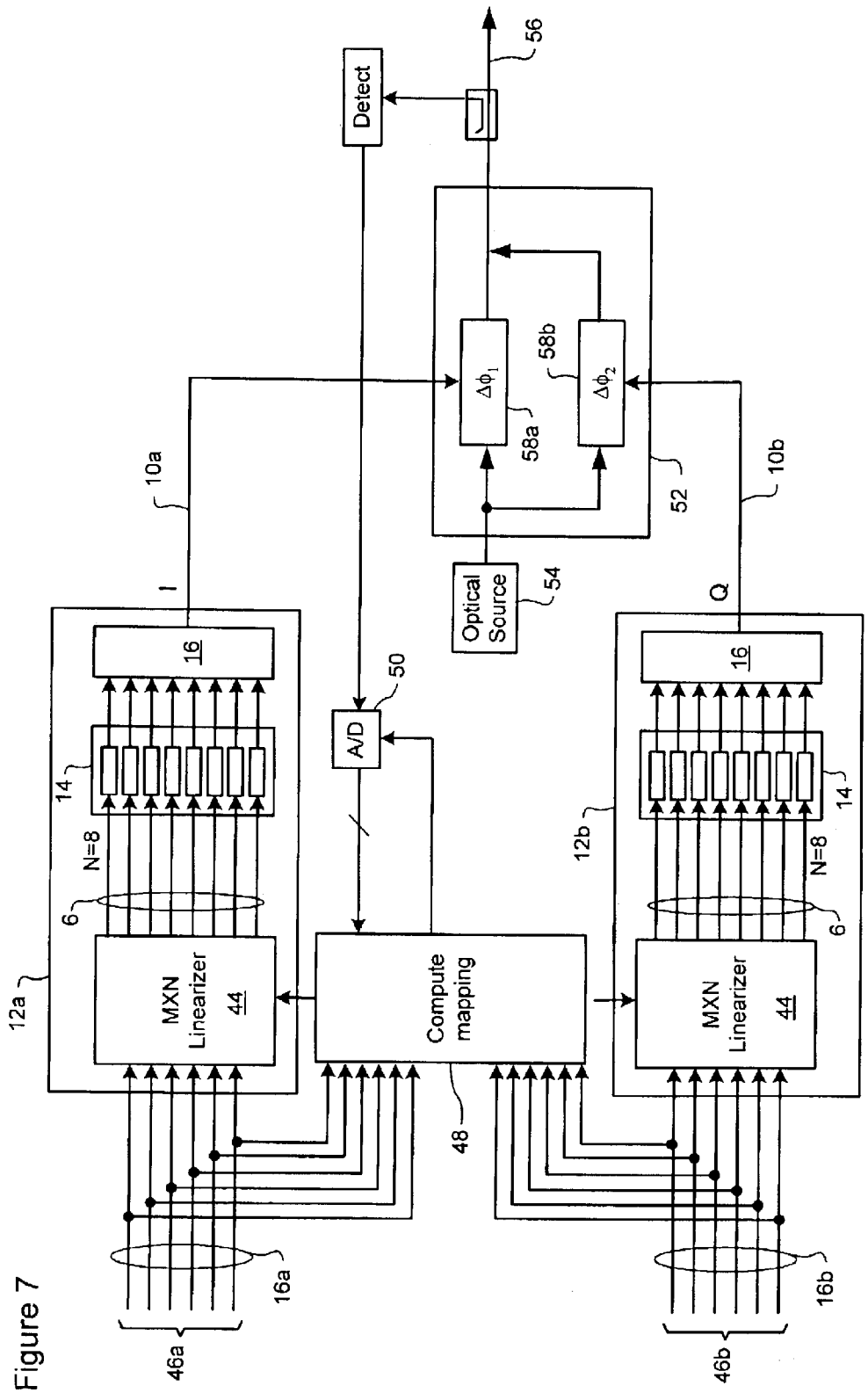
FIG. 7 is a block diagram schematically illustrating a system for driving a 2-dimensional optical modulator utilizing high-speed digital-to-analog converters in accordance with the embodiment of FIG. 6.

As is known in the art, some optical modulators are designed to modulate a pair of orthogonal components of in input optical signal. This 2-dimensional modulation performance requires that the modulator 52 be driven by a pair of independent control signals. For example, known Mach-Zehnder modulators are capable of modulating both the amplitude and phase components of an optical signal, when driven by respective In-phase and Quadrature control signals. FIG. 7 is a block diagram, in which a respective D/A converter 12 is provided for each of the control signals used to drive a 2-dimensional optical modulator 52.

Due to various factors (such as, for example imperfection in the modulator, or electrical cross-talk) the effects of the In-phase and Quadrature control signals may not be orthogonal. Accordingly, in the embodiment of FIG. 7, a single 2M×2N linearizer 44a is used, instead of separate M×N linearizers 44 for each A/D converter. The 2M×2N linearizer 44a can be constructed in substantially the same manner as the M×N linearizer described above with reference to FIGS. 5 and 6. Thus, the 2M×2N linearizer 44a can be provided as a RAM LUT. Each of the $2^{2M}$ registers of the RAM LUT stores previously calculated output values for both control signals 10a and 10b. These output values may be calculated in accordance with a mapping function, substantially as described above with reference to FIGS. 5 and 6. The most significant difference here being that the mapping function would be calculated based on both the amplitude and phase of the combined lightwave 56 emerging from the optical modulator 52.

If desired, the RAM LUT 44a can also be used to implement a mapping between different dimensions. For example, consider a pair of input M-bit digital signals 46a and 46b formatted to provide In-phase and Quadrature control signals. In addition to compensating non-linearities of the A/D converter (and/or the optical modulator 52), the 2M×2N mapping implemented in the linearizer 44a may also be used to convert these I and Q control signals into a corresponding polar coordinate control signals.

In the foregoing description of FIGS. 5–7, the analog output signal 10 generated by the (or each) high speed A/D converter 12 is used to drive an optical modulator 52 such as, for example, a Mach-Zehnder modulator. However, as is known in the art optical signal sources, such as narrow-band lasers, can be directly controlled by an analog signal. For example, it is known that, within a certain range, the optical power emitted by a narrow band laser is proportional to the input current. Thus it will be appreciated that the techniques described above with reference to FIGS. 5–7 may equally be used to drive an optical signal source, either alone, or in combination with, a downstream optical modulator.

The embodiment(s) of the invention described above is(are) intended to be exemplary only. The scope of the invention is therefore intended to be limited solely by the scope of the appended claims.

We claim:

1. A high speed Digital to Analog (D/A) converter comprising:
   a phase aligner for ensuring phase alignment between corresponding bits of a parallel N-bit digital signal having a data rate of at least 2 GHz; and
   a vector addition block adapted to perform a vector addition of corresponding bits of the parallel N-bit digital signal.

2. A D/A converter as claimed in claim 1, wherein the phase aligner comprises an array of flip-flop circuits controlled by a master clock, each flip-flop circuit being operatively connected to process a respective bit of the parallel N-bit digital signal.

3. A D/A converter as claimed in claim 2, wherein the phase aligner further comprises means for equalizing respective logic levels of each bit of the parallel N-bit digital signal.

4. A D/A converter as claimed in claim 3, wherein the means for equalizing respective logic levels comprises a precision voltage reference coupled to each flip-flop circuit, such that respective output logic levels of every flip-flop circuit are derived from the precision voltage reference.

5. A D/A converter as claimed in claim 1, wherein the phase aligner comprises an array of phase delay elements, each phase delay elements being operatively connected to impose a selected delay onto a respective bit of the parallel N-bit digital signal.

6. A D/A converter as claimed in claim 5, wherein the selected delay of each phase delay element is fixed.

7. A D/A converter as claimed in claim 6, wherein each phase delay element comprises a length of transmission line.

8. A D/A converter as claimed in claim 5, wherein the selected delay of each phase delay element is variable.

9. A D/A converter as claimed in claim 8, wherein each phase delay element comprises a controllable phase shifter.

10. A D/A converter as claimed in claim 1, wherein the vector addition block comprises:
    means for weighting each bit of the parallel N-bit digital signal; and
    a microwave signal combiner network for adding the weighted bits of the parallel N-bit digital signal.

11. A D/A converter as claimed in claim 10, wherein the microwave signal combiner network comprises a multi-stage cascade of parallel impedance matched junctions, each junction having a common insertion loss, such that each bit of the parallel N-bit digital signal suffers substantially the same loss through the combiner network.

12. A D/A converter as claimed in claim 11, wherein the means for weighting comprises an array of attenuators, each attenuator being operatively connected to impose a selected attenuation to a corresponding bit of the parallel N-bit digital signal.

13. A D/A converter as claimed in claim 12, wherein the attenuation imposed on each bit is selected to follow a power of two series between a least significant bit (LSB) and most significant bit (MSB) of the parallel N-bit digital signal.

14. A D/A converter as claimed in claim 10, wherein the microwave signal combiner network comprises a linear cascade of impedance matched junctions.

15. A D/A converter as claimed in claim 14, wherein the means for weighting comprises an insertion loss of each junction, such that each bit of the parallel N-bit digital signal suffers respective different loss through the combiner network.

16. A D/A converter as claimed in claim 15, wherein the respective loss suffered by each bit through the combiner network is selected to follow a power of two series between a least significant bit (LSB) and most significant bit (MSB) of the parallel N-bit digital signal.

17. A D/A converter as claimed in claim 15, wherein the means for weighting further comprises an array of attenuators, each attenuator being operatively connected to impose a selected attenuation to a corresponding bit of the parallel N-bit digital signal.

18. A D/A converter as claimed in claim 17, wherein the respective loss suffered by each bit through the combiner network is selected to follow a power of two series between a least significant bit (LSB) and most significant bit (MSB) of the parallel N-bit digital signal.

19. A D/A converter as claimed in claim 1, further comprising a linearizer for implementing an M×N mapping of an input parallel M-bit digital signal into the parallel N-bit digital signal.

20. A D/A converter as claimed in claim 19, wherein the M×N mapping is calculated to substantially compensate at least a non-linearity of the vector addition block.

21. A D/A converter as claimed in claim 20, further comprising a processor for periodically recalculating the M×N mapping.

22. A D/A converter as claimed in claim 20, wherein an analog output signal generated by the signal combiner network is used to drive an optical modulator, and the M×N mapping is calculated to substantially compensate a combined non-linear response of the vector addition block and the optical modulator.

23. An optical transmitter comprising:
    a high speed digital-to-analog (D/A) converter for converting a parallel N-bit digital signal into a corresponding analog signal; and
    an optical signal generator responsive to the analog signal for generating a modulated optical signal based on the analog signal.

24. An optical transmitter as claimed in claim 23, wherein the optical signal generator comprises any one of:
    a narrow band laser adapted to emit an optical signal having at least one signal parameter that is proportional to the analog signal; and
    an optical modulator for modulating an optical signal generated by a substantially fixed optical source.

25. An optical transmitter as claimed in claim 23, wherein the high speed D/A converter comprises means producing a predetermined non-linear response of the D/A converter adapted to at least partially offset a non-linear response of the optical signal generator.

26. An optical transmitter as claimed in claim 25, wherein the means producing a nonlinear response of the D/A converter comprises means for weighting each bit of the parallel N-bit digital signal.

27. An optical transmitter as claimed in claim 26, wherein the means for weighting comprises an array of attenuators, each attenuator being operatively connected to impose a selected attenuation to a corresponding bit of the parallel N-bit digital signal.

28. An optical transmitter as claimed in claim 27, wherein the selected attenuation imposed on each bit defines a 5 dB difference between adjacent bits.

29. An optical transmitter as claimed in claim 26, wherein the high speed D/A converter comprises a linear cascade of impedance matched junctions for performing a vector summation of the bits of the parallel N-bit digital signal, and wherein the means for weighting comprises an insertion loss of each junction, such that each bit of the parallel N-bit digital signal suffers respective different loss through the D/A converter.

30. A linearizer for substantially compensating at least a nonlinear response of a high-speed N-bit digital-to analog (D/A) converter, the linearizer comprising means implementing an M×N mapping of an input parallel M-bit digital signal into a parallel N-bit digital signal that is supplied to the high speed D/A converter.

31. A linearizer as claimed in claim 30, wherein the means implementing an M×N mapping comprises a Random Access Memory (RAM) look-up table (LUT).

32. A linearizer as claimed in claim 30, further comprising a processor for periodically recalculating the M×N mapping.

33. A linearizer as claimed in claim 32, wherein the processor comprises:
- an analog-to-digital converter for sampling an analog level of an output of the D/A converter; and
- a signal processor for:
  - comparing the sampled analog output level to a corresponding M-bit word of the input parallel M-bit digital signal; and
  - calculating the M×N mapping based on the comparison result.

34. A linearizer as claimed in claim 30, wherein an analog output signal generated by the D/A converter is used to drive an optical signal generator, and the M×N mapping is calculated to substantially compensate a combined non-linear response of the D/A converter and the optical signal generator.

35. A linearizer as claimed in claim 34, where the processor comprises;
- an analog-to-digital converter for sampling an analog level of an output of the optical signal generator; and
- a signal processor for:
  - comparing the sampled analog output level to a corresponding M-bit word of the input parallel M-bit digital signal; and
  - calculating the M×N mapping based on the comparison result.

36. A linearizer as claimed in claim 30, wherein a pair of parallel D/A converters generate respective analog output signals used to drive a 2-dimensional optical signal generator, and wherein the linearizer implements a 2M×2N mapping calculated to substantially compensate at least a combined non-linear response of the D/A converters and the optical signal generator.

* * * * *